United States Patent
Li

(10) Patent No.: US 11,502,262 B2
(45) Date of Patent: Nov. 15, 2022

(54) PACKAGING STRUCTURE OF ELECTROLUMINESCENT ELEMENT, METHOD FOR MANUFACTURING THE SAME, DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventor: Fashun Li, Beijing (CN)

(73) Assignees: Ordos Yuansheng Optoelectronics Co., Ltd., Inner Mongolia (CN); Beijing BOE Technology Development Co., Ltd., Beijing (CN)

( * ) Notice: Subject to any disclaimer, the term of this patent is extended or adjusted under 35 U.S.C. 154(b) by 776 days.

(21) Appl. No.: 16/341,949

(22) PCT Filed: Nov. 21, 2018

(86) PCT No.: PCT/CN2018/116627
§ 371 (c)(1),
(2) Date: Apr. 15, 2019

(87) PCT Pub. No.: WO2019/153831
PCT Pub. Date: Aug. 15, 2019

(65) Prior Publication Data
US 2021/0376264 A1 Dec. 2, 2021

(30) Foreign Application Priority Data
Feb. 6, 2018 (CN) .................. 201810116148.X

(51) Int. Cl.
*H01L 51/00* (2006.01)
*H01L 51/52* (2006.01)
(Continued)

(52) U.S. Cl.
CPC ...... *H01L 51/0097* (2013.01); *H01L 51/5253* (2013.01); *H01L 51/56* (2013.01); *H01L 27/3244* (2013.01)

(58) Field of Classification Search
CPC . H01L 51/0097; H01L 51/5253; H01L 51/56; H01L 51/5256; H01L 27/3244; H01L 51/529; H01L 51/003; Y02E 10/549
(Continued)

(56) References Cited

U.S. PATENT DOCUMENTS

| 2005/0045900 A1 | 3/2005 | Silvernail |
| 2019/0123289 A1* | 4/2019 | Yu ...................... H01L 51/0097 257/40 |

FOREIGN PATENT DOCUMENTS

| CN | 104752487 A | 7/2015 |
| CN | 106356472 A | 1/2017 |
| CN | 108365093 A | 8/2018 |

OTHER PUBLICATIONS

International Search Report and Written Opinion of the International Searching Authority (with English language translation), International Application No. PCT/CN2018/116627, dated Feb. 13, 2019, 10 pp.

* cited by examiner

*Primary Examiner* — Thinh T Nguyen
(74) *Attorney, Agent, or Firm* — Myers Bigel, P.A.

(57) ABSTRACT

A flexible display panel with an electroluminescent element, a display device, and a manufacturing method for the packaging structure of an electroluminescent element are provided. The flexible display panel comprises: a first flexible substrate, a first metal mesh on the first flexible substrate, a second flexible substrate on the first metal mesh. The bendability and the flexibility of the proposed flexible display panel are significantly enhanced, which helps to (Continued)

improve the flexibility and the bendability of a display device to which the flexible display panel is applied.

17 Claims, 2 Drawing Sheets

(51) Int. Cl.
*H01L 51/56* (2006.01)
*H01L 27/32* (2006.01)
(58) Field of Classification Search
USPC .................................. 257/40; 438/82, 99
See application file for complete search history.

US 11,502,262 B2

PACKAGING STRUCTURE OF ELECTROLUMINESCENT ELEMENT, METHOD FOR MANUFACTURING THE SAME, DISPLAY DEVICE

CROSS REFERENCE TO RELATED APPLICATIONS

The present application is a 35 U.S.C. 371 national stage application of PCT International Application No. PCT/CN2018/116627, filed on Nov. 21, 2018, which claims the benefit of Chinese Patent Application No. 201810116148.X, filed on Feb. 6, 2018, the contents of which are incorporated herein by reference in their entireties.

TECHNICAL FIELD

The present disclosure relates to the field of display technologies, especially to a packaging structure of an electroluminescent element, a method for manufacturing the same, and a display device.

BACKGROUND

Electroluminescent elements such as organic light emitting diodes (OLEDs) have been widely used currently. Since such light emitting elements are self-luminous elements, a backlight is not necessary for a display device to which an electroluminescence element is applied. For an organic light emitting diode (OLED), its working principle is that positive and negative carriers are injected into the organic light emitting layer and recombined to generate light. Display devices to which such light emitting elements are applied have a lot of advantages in performances and characteristics over liquid crystal displays, such as excellent shock resistance, high bendability, high brightness, high contrast, wide viewing angle, ultra-thinness, low cost, low power consumption, and the like.

SUMMARY

According to an aspect of the disclosure, there is provided a packaging structure of an electroluminescent element, comprising: a first flexible substrate, a first metal mesh on the first flexible substrate, and a second flexible substrate on the first metal mesh. The electroluminescent element is located on the second flexible substrate.

In some embodiments, the first metal mesh is enclosed by the first flexible substrate and the second flexible substrate.

Further, in some embodiments, an orthographic projection of the second flexible substrate on the first flexible substrate coincides with the first flexible substrate and covers an orthographic projection of the first metal mesh on the first flexible substrate. A center of the orthographic projection of the first metal mesh on the first flexible substrate coincides with a center of an upper surface of the first flexible substrate facing the first metal mesh.

In some embodiments, a material of the first metal mesh includes platinum, platinum-gold alloy or aluminum.

In some embodiments, the packaging structure further comprises a thin film packaging layer located on the electroluminescent element.

In some embodiments, the thin film packaging layer includes: a first packaging barrier layer located on the electroluminescent element; a second metal mesh located on the first packaging barrier layer; a second packaging barrier layer located on the second metal mesh.

In some embodiments, the second metal mesh is enclosed by the first packaging barrier layer and the second packaging barrier layer.

Further, in some embodiments, an orthographic projection of the second packaging barrier layer on the first packaging barrier layer coincides with the first packaging barrier layer and covers an orthographic projection of the second metal mesh on the first packaging barrier layer. A center of the orthographic projection of the second metal mesh on the first packaging barrier layer coincides with a center of an upper surface of the first packaging barrier layer facing the second metal mesh.

In some embodiments, the thin film packaging layer further includes a buffer layer located on the second packaging barrier layer.

In some embodiments, the thin film packaging layer further includes a third packaging barrier layer on the buffer layer.

In some embodiments, the packaging structure further comprises: a driving circuit layer between the second flexible substrate and the electroluminescent element.

In some embodiments, the electroluminescent element comprises an organic light emitting diode.

Another embodiment of the present disclosure provides a display panel comprising the packaging structure of an electroluminescent element as described in any of the foregoing embodiments.

Further, a further embodiment of the present disclosure provides a display device comprising the display panel described in the foregoing embodiment.

Correspondingly, yet another embodiment of the present disclosure provides a manufacturing method for a packaging structure of an electroluminescent element, comprising: forming a first flexible substrate; disposing a first metal mesh on the first flexible substrate; forming a second flexible substrate on the first metal mesh; forming an electroluminescent element on the second flexible substrate.

Further, in some embodiments, the manufacturing method further comprises: forming a first packaging barrier layer on the electroluminescent element; forming a second metal mesh on the first packaging barrier layer; forming a second packaging barrier layer on the second metal mesh.

Further, in some embodiments, the manufacturing method further comprises: forming a buffer layer on the second packaging barrier layer; forming a third packaging barrier layer on the buffer layer.

It is to be understood that the above general description and the following detailed description are exemplary and illustrative only, which do not limit the scope of the present application.

BRIEF DESCRIPTION OF DRAWINGS

The drawings herein are incorporated into and constitute a part of the specification, which are used for illustrating the principle of the disclosure together with embodiments of the specification.

DETAILED DESCRIPTION OF EMBODIMENTS

Figure 1:
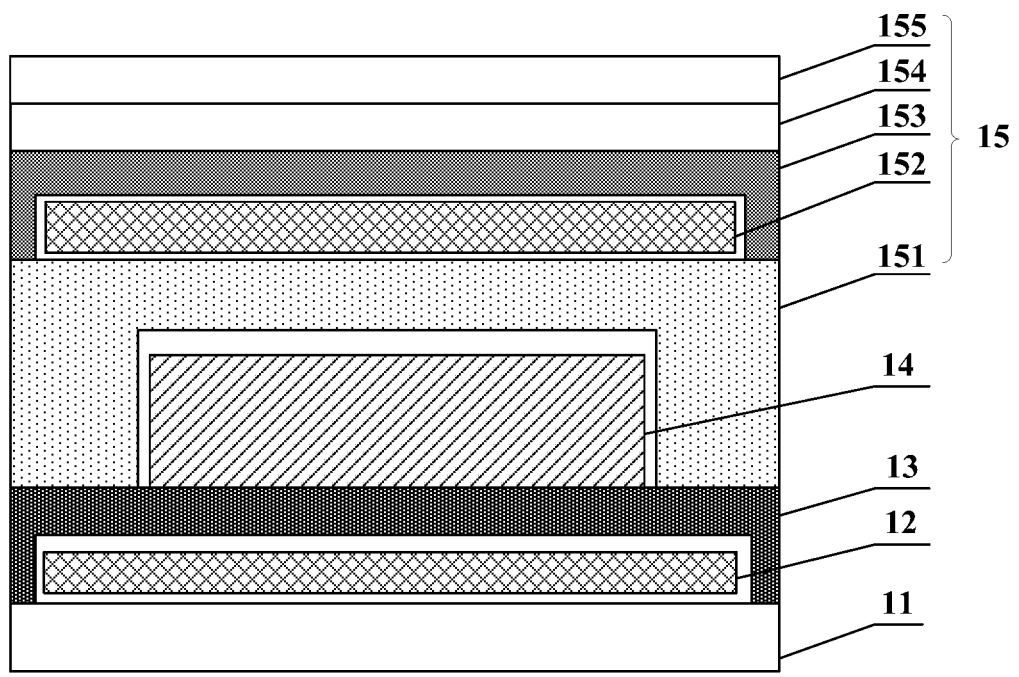
FIG. 1 is a view illustrating a packaging structure of an electroluminescent element according to an embodiment of the present disclosure.

Exemplary embodiments will be described in detail herein, examples of which are illustrated in the accompanying drawings. Where the description below refers to the accompanying drawings, the same reference numeral in different drawings denotes the same or similar elements, unless defined otherwise. The exemplary embodiments described below are not intended to represent all possible embodiments that apply the inventive concept revealed by the disclosure, but rather, they are only some examples of products and methods that are described in detail in the appended claims and embody the inventive concept of the disclosure.

The inventors of the application have realized that, the substrate, the OLED element, and the packaging layer in a common OLED packaging structure typically include a polymer material (e.g., plastic) and an organic/inorganic chemical layer, and the entire packaging structure for the OLED element has limited bendability, can hardly withstand multiple, wide-angle bends, and has poor restorability after bending.

FIG. 1 shows a packaging structure of an electroluminescent element according to an embodiment of the disclosure. The packaging structure comprises a first flexible substrate 11, a first metal mesh 12, a second flexible substrate 13, and an electroluminescent element (e.g., an OLED) 14. As shown in FIG. 1, the first metal mesh 12 is located between the first flexible substrate 11 and the second flexible substrate 13. The electroluminescent element 14 is located on the second flexible substrate 13.

In this embodiment, because the first metal mesh 12 is arranged between the first flexible substrate 11 and the second flexible substrate 13, and the metal material is characterized by its high flexibility, the bendability of the entire packaging structure of the electroluminescent element can be enhanced, which improves the flexibility of the packaging structure without badly affecting the adhesiveness between the first flexible substrate 11 and the second flexible substrate 13.

According to some embodiments of the disclosure, as shown in FIG. 1, the first metal mesh 12 is enclosed by the first flexible substrate 11 and the second flexible substrate 13. In this way, the first metal mesh 12 can be brought into close contact with the first flexible substrate 11 and the second flexible substrate 13. Further, as shown in FIG. 1, in an embodiment, the area of the first metal mesh 12 is smaller than the area of the first flexible substrate 11, and the first metal mesh 12 may be located in the center of the first flexible substrate 11. Specifically, the center point of the first metal mesh 12 may coincide with the center point of the upper surface of the first flexible substrate 11 facing the second flexible substrate in the vertical direction. The area of the second flexible substrate 13 is the same as that of the first flexible substrate 11, and the second flexible substrate 13 covers the first metal mesh 12. In this embodiment, the area of the first flexible substrate 11 refers to the area of the upper surface of the first flexible substrate 11 facing the first metal mesh 12, and the area of the first metal mesh 12 refers to the area of a region on the upper surface of the first flexible substrate 11 which is occupied by the first metal mesh 12. That is, in this embodiment, the orthographic projection of the second flexible substrate on the first flexible substrate coincides with the first flexible substrate and covers the orthographic projection of the first metal mesh on the first flexible substrate. Further, the center of the orthographic projection of the first metal mesh on the first flexible substrate coincides with the center of the upper surface of the first flexible substrate facing the first metal mesh. In this way, the first metal mesh is confined to a central position between the first flexible substrate and the second flexible substrate, which facilitates to achieve uniform improvement of the flexibility of the packaging structure and can prevent displacement of the first metal mesh after the packaging structure has been bent multiple times.

In an embodiment, the material of the first metal mesh 12 may include platinum, platinum-gold alloy or aluminum, etc. As a result, an enhanced flexibility of the first metal mesh 12 can be achieved.

Figure 2:
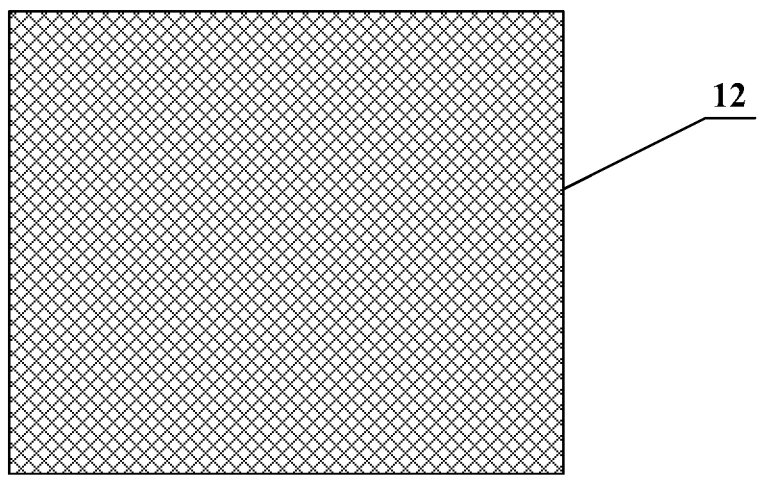
FIG. 2 is a view illustrating the structure of a first metal mesh according to an embodiment of the present disclosure.

An example of the structure of the first metal mesh 12 is shown in FIG. 2, but is not limited to the structure shown in FIG. 2. In FIG. 2, metal wires of the first metal mesh 12 are interlaced with each other to form a rectangular hollow structure.

As shown in FIG. 1, in an embodiment, the packaging structure of an electroluminescent element may further comprise a thin film packaging layer 15 covering the electroluminescent element 14. In an embodiment, the thin film packaging layer 15 may be a transparent film layer.

As shown in FIG. 1, in an embodiment, the thin film packaging layer 15 may include a first packaging barrier layer 151, a second metal mesh 152, and a second packaging barrier layer 153. The first packaging barrier layer 151 is on the electroluminescent element 14, the second metal mesh 152 is on the first packaging barrier layer 151, and the second packaging barrier layer 153 is on the second metal mesh 152.

Due to the mesh structure of the second metal mesh 152, and because the metal material has high flexibility, by arranging the second metal mesh 152 between the first packaging barrier layer 151 and the second packaging barrier layer 153, the bendability of the entire packaging structure of the electroluminescent element can be further enhanced, which further improves the flexibility of the packaging structure. Meanwhile, the arrangement of the second metal mesh will not badly affect the adhesiveness between the first packaging barrier layer 151 and the second packaging barrier layer 153.

According to some embodiments of the disclosure, the second metal mesh 152 is enclosed by the first packaging barrier layer 151 and the second packaging barrier layer 153. In an embodiment, the second metal mesh 152 may have a structure similar to that is shown in FIG. 2, but is not limited to the structure shown in FIG. 2.

In an embodiment, the first packaging barrier layer 151 and the second packaging barrier layer 153 are both configured to block gas or liquid components such as water and oxygen in an external environment. The materials forming the first packaging barrier layer and the second packaging barrier layer include, but are not limited to $Al_2O_3$, $TiO_2$, $ZrO_2$, $MgO$, $HFO_2$, $Ta_2O_5$, $Si_3N_4$, $AlN$, $SiN$, $SiNO$, $SiO$, $SiO_2$, $SiC$, $SiCN_x$, ITO, IZO, and the like. The material of the second metal mesh 152 may include platinum, platinum-gold alloy or aluminum, etc.

As shown in FIG. 1, in an embodiment, the area of the second metal mesh 152 is smaller than the area of the first packaging barrier layer 151, and the second metal mesh 152 is located on the center of the first packaging barrier layer 151. Specifically, the center of the second metal mesh 152 may coincide with the center of the upper surface of the first packaging barrier layer 151 facing the second packaging barrier layer in the vertical direction. The area of the second packaging barrier layer 153 is the same as the area of the first packaging barrier layer 151. The second packaging barrier layer 153 covers the second metal mesh 152. The area of the first packaging barrier layer 151 refers to the area of the upper surface thereof facing the second metal mesh 152, and the area of the second packaging barrier layer 153 refers to the area of the surface thereof away from the second metal mesh 152. Therefore, in some embodiments, the orthographic projection of the second packaging barrier layer on the first packaging barrier layer coincides with the first packaging barrier layer and covers the orthographic projection of the second metal mesh on the first packaging barrier layer. Moreover, the center of the orthographic projection of the second metal mesh on the first packaging barrier layer coincides with the center of the upper surface of the first packaging barrier layer facing the second metal mesh. In this way, the second metal mesh can be confined to a central position between the second packaging barrier layer and the first packaging barrier layer, so that the second metal mesh contributes to uniform improvement of the flexibility of the packaging structure, and displacement of the second metal mesh after the packaging structure has been bent multiple times can be prevented.

As shown in FIG. 1, in an embodiment, the thin film packaging layer 15 further includes a buffer layer 154 and a third packaging barrier layer 155. The buffer layer 154 is located on the second packaging barrier layer 153, and the third packaging barrier layer 155 is located on the buffer layer 154. The third packaging barrier layer 155 is configured to block water and oxygen, and the material thereof may be the same as the material of the first packaging barrier layer 151. The material of the buffer layer 154 may include a transparent conductive resin, thus the buffer layer 154 has high elasticity and may facilitate to suppress cracking of the packaging barrier layers (the first packaging barrier layer 151, the second packaging barrier layer 153, and the third packaging barrier layer 155) and release stresses between inorganic layers.

Figure 3:
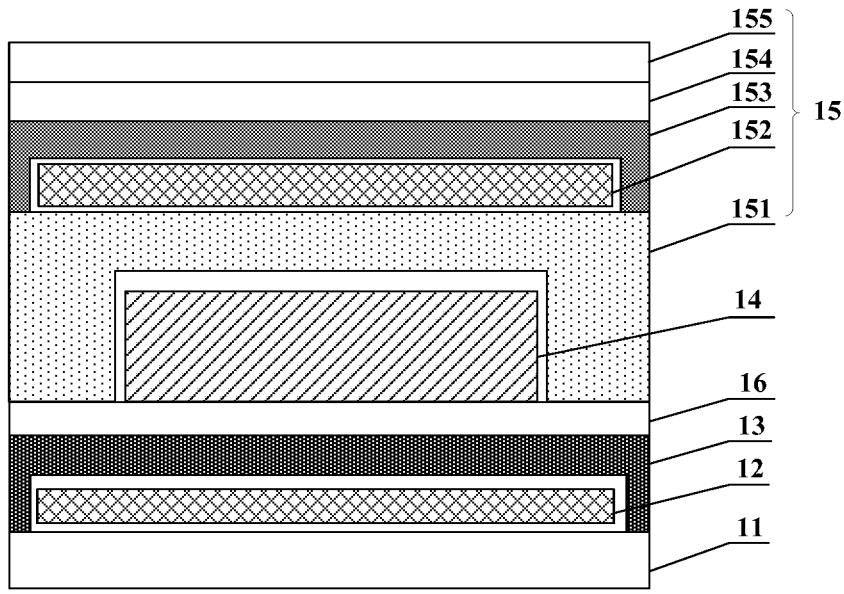
FIG. 3 is a view illustrating a packaging structure of an electroluminescent element according to another embodiment of the present disclosure.

As shown in FIG. 3, in an embodiment, the packaging structure of the electroluminescent element further comprises a driving circuit layer 16. The driving circuit layer 16 is located between the second flexible substrate 13 and the electroluminescent element 14, for driving the electroluminescent element 14. The driving circuit layer may include circuit structures such as a thin film transistor (TFT) and its associated electrical components. It can be appreciated that the electroluminescent element referred to in the disclosure may be any type of electroluminescent element in the art including, but not limited to, an OLED, an LED, and the like.

Another embodiment of the present disclosure provides a display panel comprising the packaging structure described in any of the foregoing embodiments.

A further embodiment of the disclosure proposes a display device comprising the display panel described in the foregoing embodiment. The display device in this embodiment may be any product or component having a display function, such as an electronic paper, a mobile phone, a tablet computer, a television, a notebook computer, a digital photo frame, a navigator, and the like.

Since the flexibility and the bendability of the packaging structure of the electroluminescent element is enhanced, the flexibility of the display panel and the display device to which such a packaging structure is applied can also be improved. Due to the improvement of the bendability of a flexible display device, the lifetime thereof is prolonged.

Figure 4:
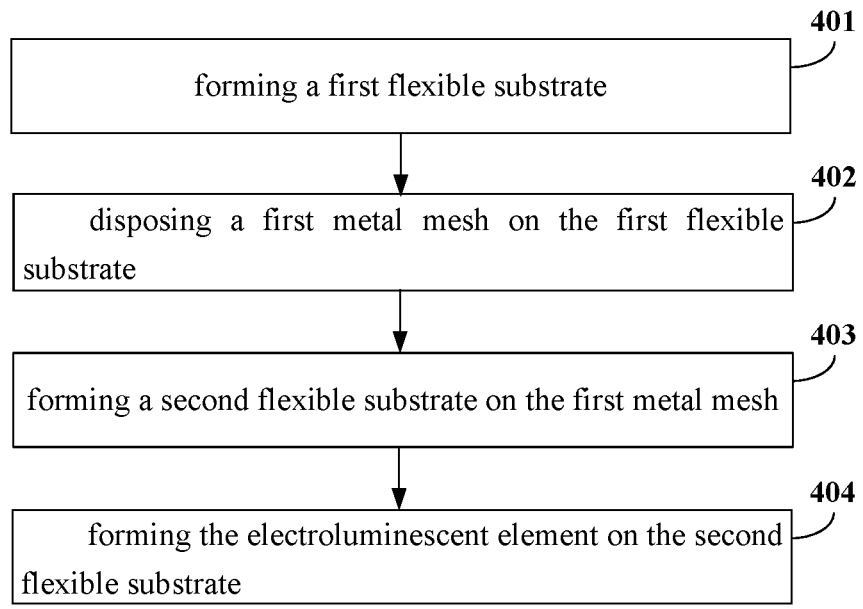
FIG. 4 is a flow chart of a manufacturing method for a packaging structure of an electroluminescent element according to an embodiment of the present disclosure.

As shown in FIG. 4, an embodiment of the present disclosure further provides a manufacturing method for a packaging structure of an electroluminescent element, comprising the following steps 401 to 404:

in step 401, forming a first flexible substrate; in step 402, disposing a first metal mesh on the first flexible substrate; in step 403, forming a second flexible substrate on the first metal mesh; in step 404, forming an electroluminescent element on the second flexible substrate.

The first metal mesh is disposed between the first flexible substrate and the second flexible substrate, and the metal material is characterized by high flexibility, so the bendability of the fabricated packaging structure of the electroluminescent element can be enhanced, which improves the flexibility of the packaging structure.

In some embodiments, the processes for forming the various layers of the packaging structure may include a film formation process such as deposition, sputtering, and the like, and a patterning process such as etching.

In another embodiment, the manufacturing method for a packaging structure of an electroluminescent element further comprises: forming a first packaging barrier layer on the electroluminescent element; forming a second metal mesh on the first packaging barrier layer; forming a second packaging barrier layer on the second metal mesh. Further, in another embodiment, the manufacturing method further comprises: forming a buffer layer on the second packaging barrier layer; forming a third packaging barrier layer on the buffer layer.

In the drawings, the dimensions of layers and regions may be exaggerated for clarity of illustration. Moreover, it should be understood that when an element or layer is referred to as being "on" or "above" another element or layer, it may be directly on said another element, or an intermediate layer may be present. In addition, it should be understood that when an element or layer is referred to as being "under" or "below" another element or layer, it may be directly below said another element, or more than one intermediate layer or element may be present. In addition, when a layer or element is referred to as being "between" two layers or two elements, it may be a single layer between two layers or two elements, or more than one intermediate layer or element may be further present. In the disclosure, the terms "first" and "second" are used for descriptive purposes only and are not to be construed as indicating or implying relative importance. The term "a plurality of" and "multiple" refer to two or more, unless specifically defined otherwise.

The scope of the application is not limited to the embodiments described herein, but is intended to encompass these embodiments as well as other variant embodiments, usages or adaptations, etc. that are readily available to those skilled in the art after knowing the contents disclosed by the present disclosure and the embodiments. These variant embodiments, usages or adaptations follow the general principles of the present disclosure and contain common knowledge or conventional technical measures in this technical field that are not mentioned herein. Accordingly, the specification and embodiments are to be regarded as illustrative only, and the real scope and spirit of the disclosure are indicated by the appended claims.

To sum up, the present application is not limited to the specific structures that have been described above and shown in the drawings. Various modifications and variations can be made by those skilled in the art without departing from the essential sprit of the present disclosure. The scope of the present application is defined by the appended claims.

The invention claimed is:
1. A flexible display panel comprising an electroluminescent element, the flexible display panel comprising:
   a first flexible substrate;
   a first metal mesh on the first flexible substrate; and
   a second flexible substrate on the first metal mesh,
   wherein the flexible display panel further comprises a thin film packaging layer on the electroluminescent element,
   wherein the thin film packaging layer comprises:
      a first packaging barrier layer on the electroluminescent element;
      a second metal mesh on the first packaging barrier layer; and
      a second packaging barrier layer on the second metal mesh.
2. The flexible display panel according to claim 1, wherein the first metal mesh is between the first flexible substrate and the second flexible substrate.
3. The flexible display panel according to claim 2, wherein an orthographic projection of the second flexible substrate on the first flexible substrate coincides with the first flexible substrate and overlaps an orthographic projection of the first metal mesh on the first flexible substrate.
4. The flexible display panel according to claim 1, wherein a material of the first metal mesh comprises platinum, platinum-gold alloy or aluminum.
5. The flexible display panel according to claim 1, wherein the second metal mesh is between the first packaging barrier layer and the second packaging barrier layer.
6. The flexible display panel according to claim 5, wherein an orthographic projection of the second packaging barrier layer on the first packaging barrier layer coincides with the first packaging barrier layer and overlaps an orthographic projection of the second metal mesh on the first packaging barrier layer.
7. The flexible display panel according to claim 5, wherein the thin film packaging layer further comprises a buffer layer on the second packaging barrier layer.
8. The flexible display panel according to claim 7, wherein the thin film packaging layer further comprises a third packaging barrier layer on the buffer layer.
9. The flexible display panel according to claim 1, wherein a packaging structure of the flexible display panel comprises a driving circuit layer between the second flexible substrate and the electroluminescent element.
10. The flexible display panel according to claim 1, wherein the electroluminescent element comprises an organic light emitting diode.
11. A display device comprising the flexible display panel according to claim 1.
12. A manufacturing method for a packaging structure of the electroluminescent element according to claim 1, comprising:
   forming the first flexible substrate;
   forming the first metal mesh on the first flexible substrate;
   forming the second flexible substrate on the first metal mesh; and
   forming the electroluminescent element on the second flexible substrate.
13. The manufacturing method according to claim 12, further comprising:
   forming a first packaging barrier layer on the electroluminescent element;
   forming a second metal mesh on the first packaging barrier layer; and
   forming a second packaging barrier layer on the second metal mesh.
14. The manufacturing method according to claim 13, further comprising:
   forming a buffer layer on the second packaging barrier layer; and
   forming a third packaging barrier layer on the buffer layer.
15. The flexible display panel according to claim 1, wherein the electroluminescent element is on the second flexible substrate.
16. The flexible display panel according to 10, wherein a material of the first packaging barrier layer, the second packaging barrier layer or the third packaging barrier layer comprises as least one selected from a group comprising $Al_2O_3$, $TiO_2$, $ZrO_2$, MgO, $HFO_2$, $Ta_2O_5$, $Si_3N_4$, AlN, SiN, SiNO, SiO, $SiO_2$, SiC, $SiCN_x$, ITO and IZO.
17. The flexible display panel according to 7, wherein a material of the buffer layer comprises a transparent conductive resin.

* * * * *